United States Patent
Rai et al.

(10) Patent No.: US 11,547,024 B2
(45) Date of Patent: Jan. 3, 2023

(54) ELECTRICAL ASSEMBLY

(71) Applicant: Lear Corporation, Southfield, MI (US)

(72) Inventors: Rutunj Rai, Canton, MI (US); Daniel Jilg, Novi, MI (US); Aric Anglin, Rives Junction, MI (US); Parminder Brar, Windsor (CA); Michael S. Duco, Fraser, MI (US); Zheyuan Ding, Northville, MI (US)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 17/071,588

(22) Filed: Oct. 15, 2020

(65) Prior Publication Data

US 2021/0112680 A1   Apr. 15, 2021

Related U.S. Application Data

(60) Provisional application No. 62/915,568, filed on Oct. 15, 2019.

(51) Int. Cl.
*H05K 7/20* (2006.01)
*H02M 7/00* (2006.01)

(52) U.S. Cl.
CPC ............ *H05K 7/209* (2013.01); *H02M 7/003* (2013.01); *H05K 7/2039* (2013.01); *H05K 7/20254* (2013.01)

(58) Field of Classification Search
None
See application file for complete search history.

(56) References Cited

U.S. PATENT DOCUMENTS

| | | | |
|---|---|---|---|
| 6,198,630 B1 | 3/2001 | Cromwell | |
| 6,916,122 B2 | 7/2005 | Branch et al. | |
| 7,164,584 B2 | 1/2007 | Walz | |
| 7,315,448 B1 | 1/2008 | Bash et al. | |
| 7,371,965 B2 | 5/2008 | Ice | |
| 7,837,496 B1* | 11/2010 | Pal ...................... | H01R 9/2466 439/485 |

(Continued)

FOREIGN PATENT DOCUMENTS

| | | |
|---|---|---|
| CN | 202550899 U | 11/2012 |
| CN | 108140793 A | 6/2018 |

OTHER PUBLICATIONS

Chinese Office Action dated Nov. 3, 2022 for Chinese Patent Application No. 202011102754.

*Primary Examiner* — Courtney L Smith
(74) *Attorney, Agent, or Firm* — Fishman Stewart PLLC

(57) ABSTRACT

An electrical assembly may include a first contactor, a second contactor, a bus bar assembly electrically connected to the first contactor and the second contactor, a cooling member, a bracket configured to connect the cooling member to the first contactor and the second contactor, and/or potting material that may be disposed at least partially between the bus bar assembly and the cooling member. A method of assembling an electrical assembly may include disposing the first contactor and the second contactor on a fixture, connecting the bus bar assembly to the first contactor and the second contactor, connecting the bracket to the bus bar assembly, the first contactor, and/or the second contactor, connecting the cooling member to the bracket, and/or providing the potting material between the bus bar assembly and the cooling member.

20 Claims, 14 Drawing Sheets

(56) References Cited

U.S. PATENT DOCUMENTS

| | | |
|---|---|---|
| 9,137,925 B2 | 9/2015 | Pal et al. |
| 9,142,364 B2 * | 9/2015 | Pal ........................... H01H 1/62 |
| 9,313,930 B2 | 4/2016 | Goth et al. |
| 9,855,903 B1 | 1/2018 | Pal |
| 9,991,655 B2 * | 6/2018 | Pal ........................... H02G 5/10 |
| 10,057,974 B2 * | 8/2018 | Pal ........................ H01H 50/12 |
| 10,637,112 B2 | 4/2020 | Shin et al. |
| 10,673,211 B2 * | 6/2020 | Pal ........................... H01H 9/52 |
| 10,971,873 B2 * | 4/2021 | Rai .......................... H01H 1/62 |
| 11,156,409 B2 * | 10/2021 | Zhang ................. F28D 15/0275 |
| 2006/0120001 A1 | 6/2006 | Weber et al. |
| 2013/0257569 A1 * | 10/2013 | Pal ........................ H01H 50/12 |
| | | 335/202 |
| 2016/0028216 A1 | 1/2016 | Pal |
| 2018/0020574 A1 * | 1/2018 | Pal ..................... H05K 7/20509 |
| 2018/0132343 A1 * | 5/2018 | Pal ......................... H02B 1/056 |
| 2019/0311870 A1 * | 10/2019 | Pal ........................ H01H 50/14 |
| 2020/0136326 A1 | 4/2020 | Rai et al. |
| 2021/0222956 A1 * | 7/2021 | Zhang ................. F28D 15/0275 |
| 2021/0226425 A1 * | 7/2021 | Schmidt .................. B60R 16/03 |

* cited by examiner

ELECTRICAL ASSEMBLY

CROSS-REFERENCE TO RELATED APPLICATION

This application claims the benefit of U.S. Provisional Patent Application Ser. No. 62/915,568, filed on Oct. 15, 2019, the disclosure of which is hereby incorporated by reference in its entirety as though fully set forth herein.

TECHNICAL FIELD

The present disclosure generally relates to electrical assemblies, including electrical assemblies that may include one or more contactors that may be used in connection with large electrical currents.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Some electrical assemblies are not configured for use with large electrical currents and some electrical assemblies may not be configured to sufficiently dissipate heat generated via large electrical currents.

There is a desire for solutions/options that minimize or eliminate one or more challenges or shortcomings of electrical assemblies. The foregoing discussion is intended only to illustrate examples of the present field and is not a disavowal of scope.

SUMMARY

In embodiments, an electrical assembly may include a first contactor, a second contactor, a bus bar assembly electrically connected to the first contactor and the second contactor, a cooling member, a bracket configured to connect the cooling member to the first contactor and the second contactor, and/or potting material that may be disposed at least partially between the bus bar assembly and the cooling member.

With embodiments, a method of assembling an electrical assembly may include disposing the first contactor and the second contactor on a fixture, connecting the bus bar assembly to the first contactor and the second contactor, connecting the bracket to the bus bar assembly, the first contactor, and/or the second contactor, connecting the cooling member to the bracket, and/or providing the potting material between the bus bar assembly and the cooling member.

With embodiments, an electrical assembly may include a third contactor, a fourth contactor, a second bus bar assembly electrically connected to the third contactor and the fourth contactor, a second cooling member, a second bracket configured to connect the cooling member with the third contactor and the fourth contactor. and/or second potting material that may be disposed at least partially between the second bus bar assembly and the second cooling member.

In embodiments, a method of operating an electrical assembly may include providing power from a power source to a first electrical load via the bus bar assembly, the first contactor, the second bus bar assembly, and the third contactor; dissipating heat, while providing power to said first electrical load, from the first contactor via the second contactor; and/or dissipating heat, while providing power to said first electrical load and dissipating heat from the first contactor, from the third contactor via the fourth contactor.

The foregoing and other potential aspects, features, details, utilities, and/or advantages of examples/embodiments of the present disclosure will be apparent from reading the following description, and from reviewing the accompanying drawings.

BRIEF DESCRIPTION OF THE DRAWINGS

While the claims are not limited to a specific illustration, an appreciation of various aspects may be gained through a discussion of various examples. The drawings are not necessarily to scale, and certain features may be exaggerated or hidden to better illustrate and explain an innovative aspect of an example. Further, the exemplary illustrations described herein are not exhaustive or otherwise limiting, and are not restricted to the precise form and configuration shown in the drawings or disclosed in the following detailed description. Exemplary illustrations are described in detail by referring to the drawings as follows:

DETAILED DESCRIPTION

Reference will now be made in detail to embodiments of the present disclosure, examples of which are described herein and illustrated in the accompanying drawings. While the present disclosure will be described in conjunction with embodiments and/or examples, they do not limit the present disclosure to these embodiments and/or examples. On the contrary, the present disclosure covers alternatives, modifications, and equivalents.

Figure 1:
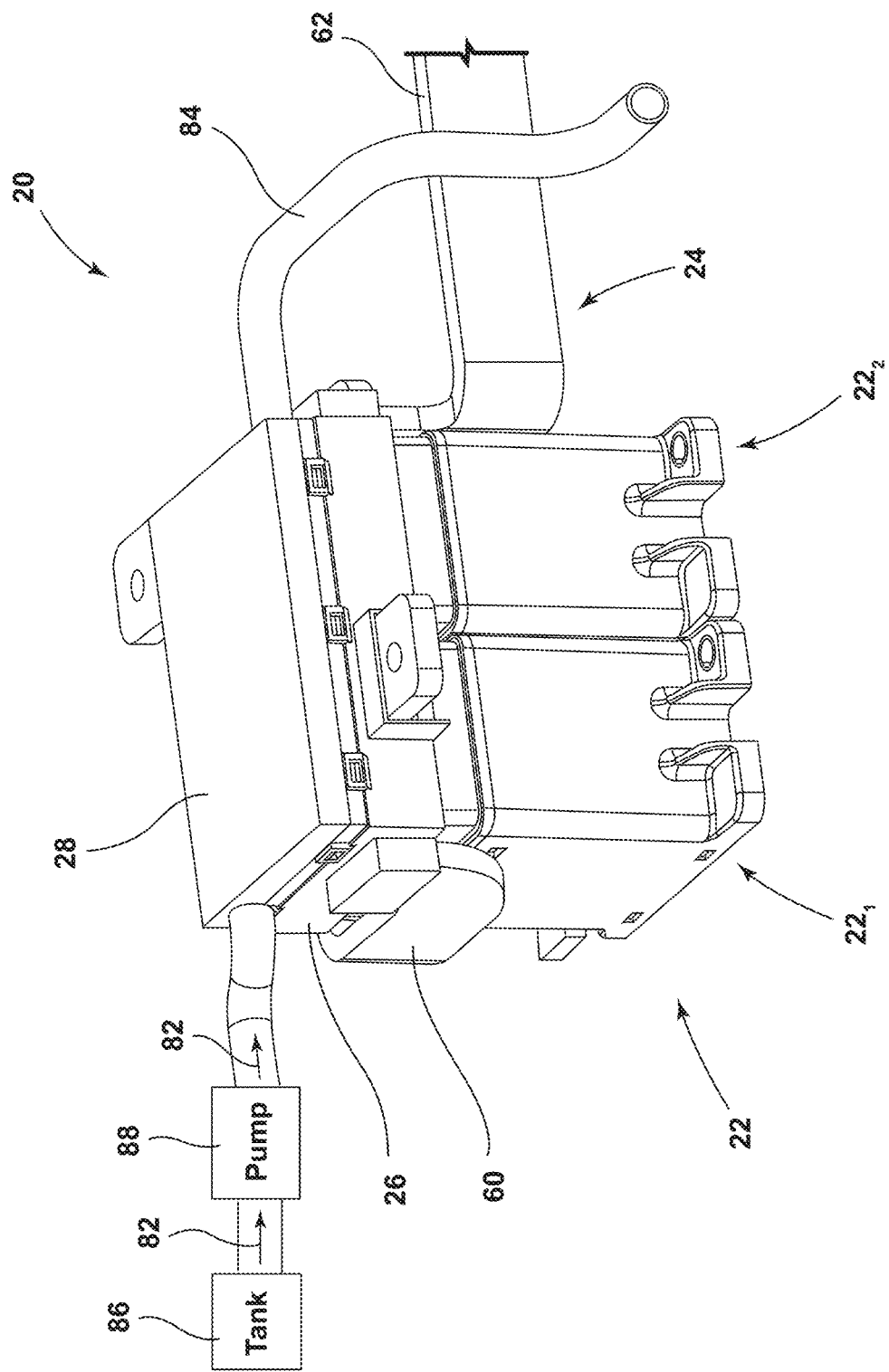
FIG. 1 is a perspective view generally illustrating an embodiment of an electrical assembly according to teachings of the present disclosure.
Figure 2:
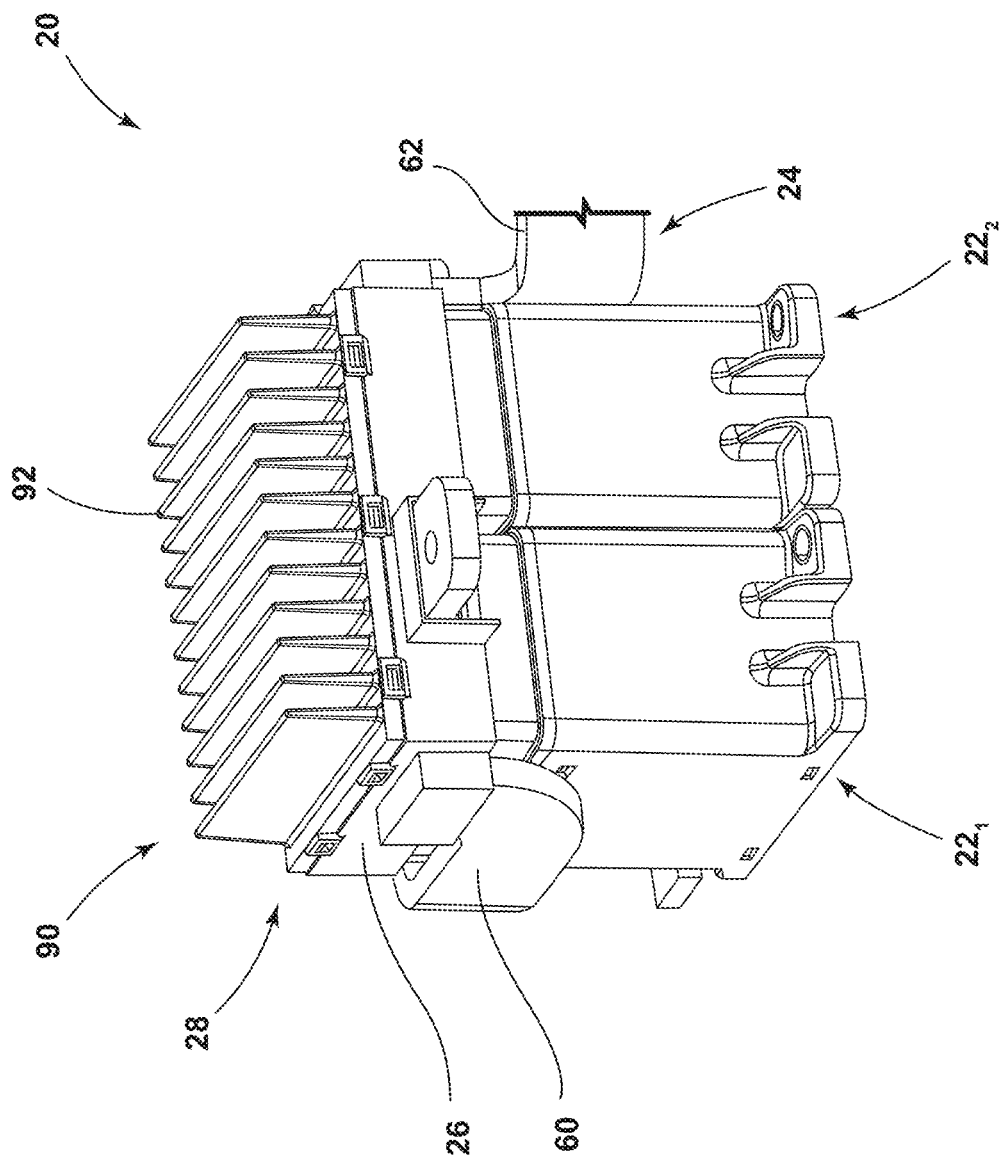
FIG. 2 is a perspective view generally illustrating an embodiment of an electrical assembly according to teachings of the present disclosure.

In embodiments, such as generally illustrated in FIGS. 1 and 2, an electrical assembly 20 may include one or more contactors 22 (or relay, electrical switch, etc.), such as first contactor $22_1$ and a second contactor $22_2$, a bus bar assembly 24, a bracket 26, and/or a cooling member 28. Electrical currents flowing through the bus bar assembly 24 and/or the contactors 22 may generate or result in a large amount of heat. For example and without limitation, an electrical assembly 20 and/or the contactors 22 may be configured for use with currents of at least 500 Amps (e.g., for several minutes or more), at least 1000 Amps, and/or at least 2500 Amps (e.g., for at least 10-15 seconds). The cooling member 28 may be configured to facilitate dissipation of at least some of the generated heat.

Figure 5:
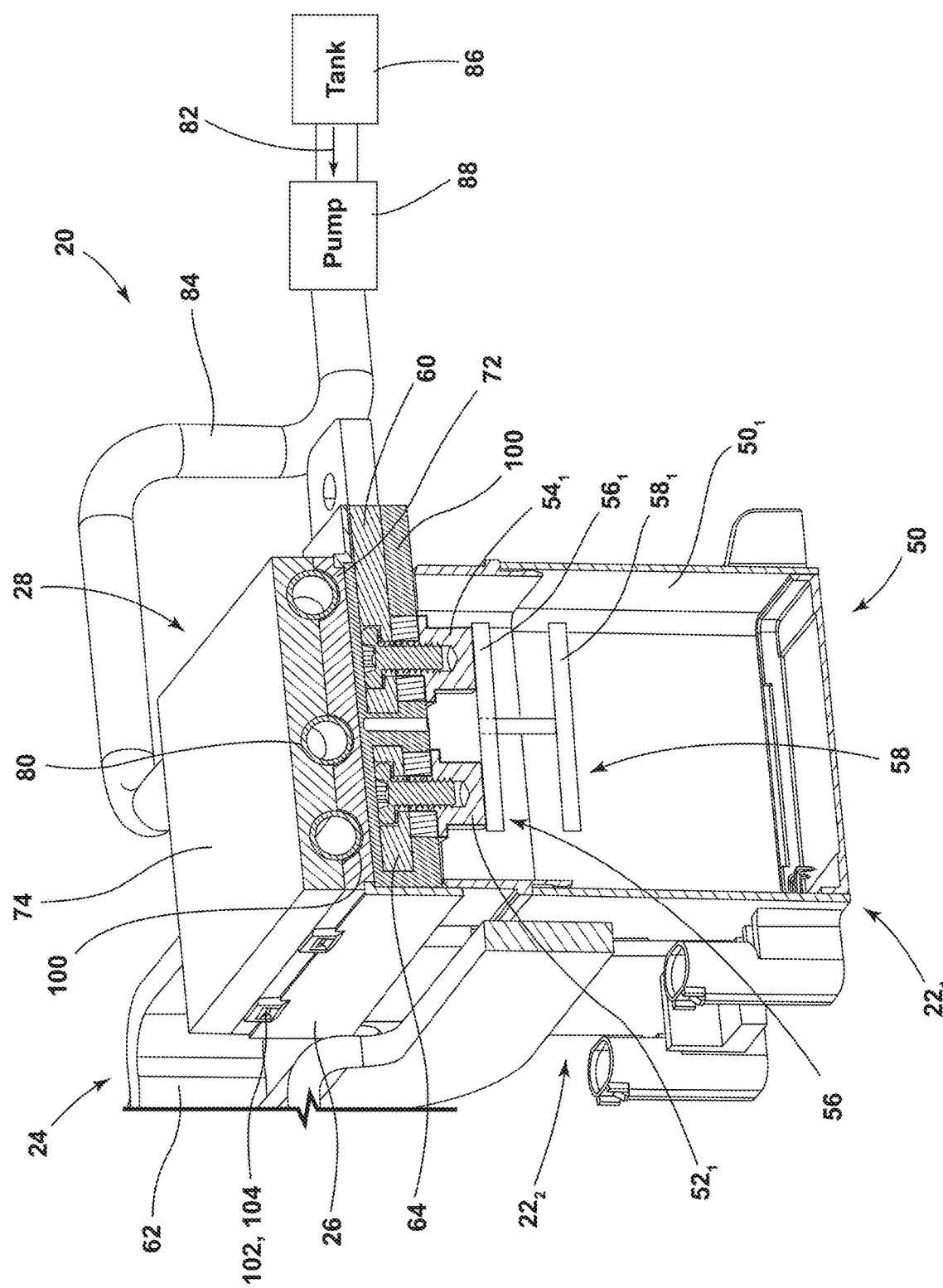
FIG. 5 is a cross-sectional perspective view generally illustrating an embodiment of an electrical assembly according to teachings of the present disclosure.
Figure 6A:
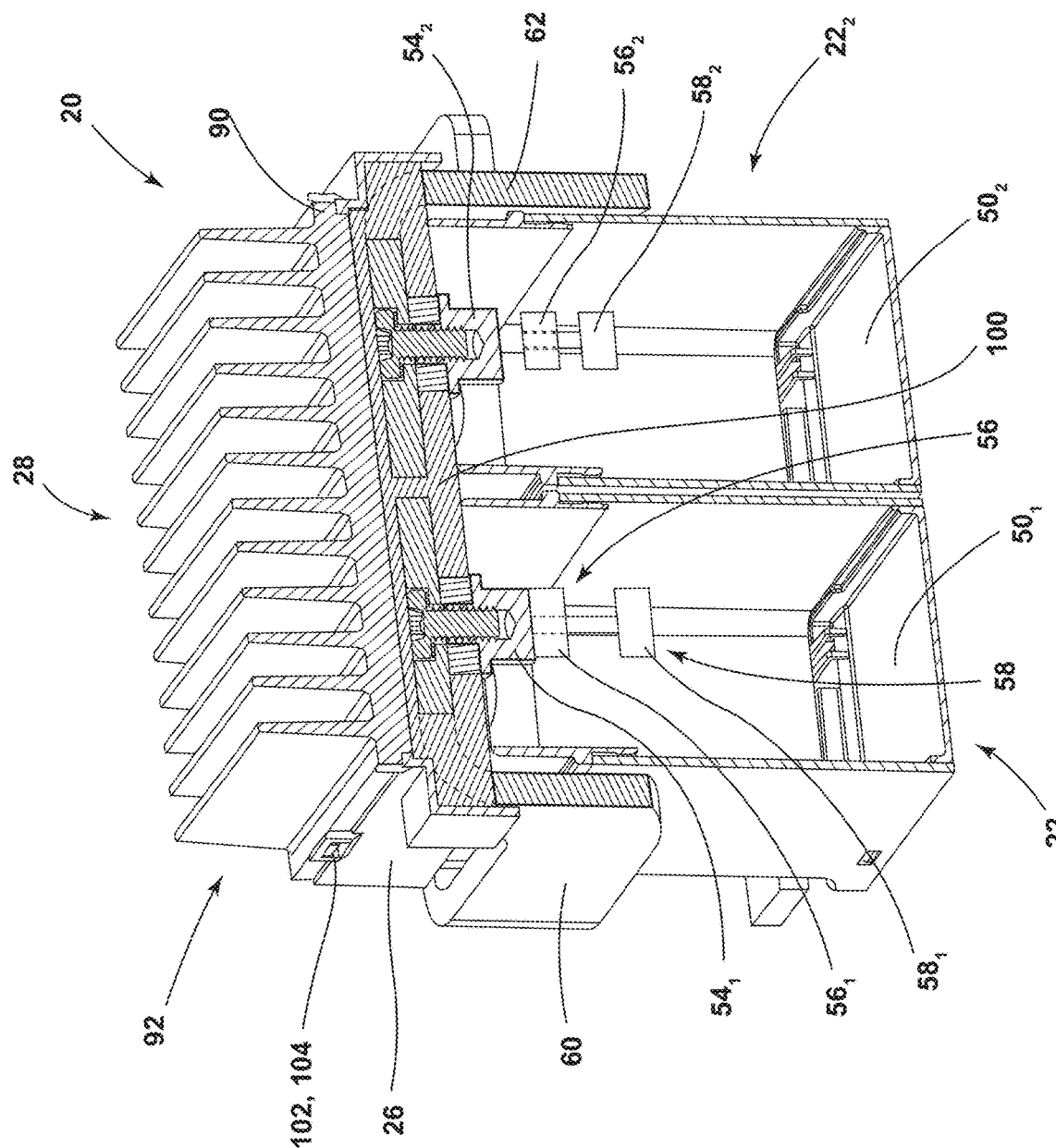
FIG. 6A is a cross-sectional perspective view generally illustrating an embodiment of an electrical assembly with an active first contactor and an inactive second contactor according to teachings of the present disclosure.
Figure 6B:
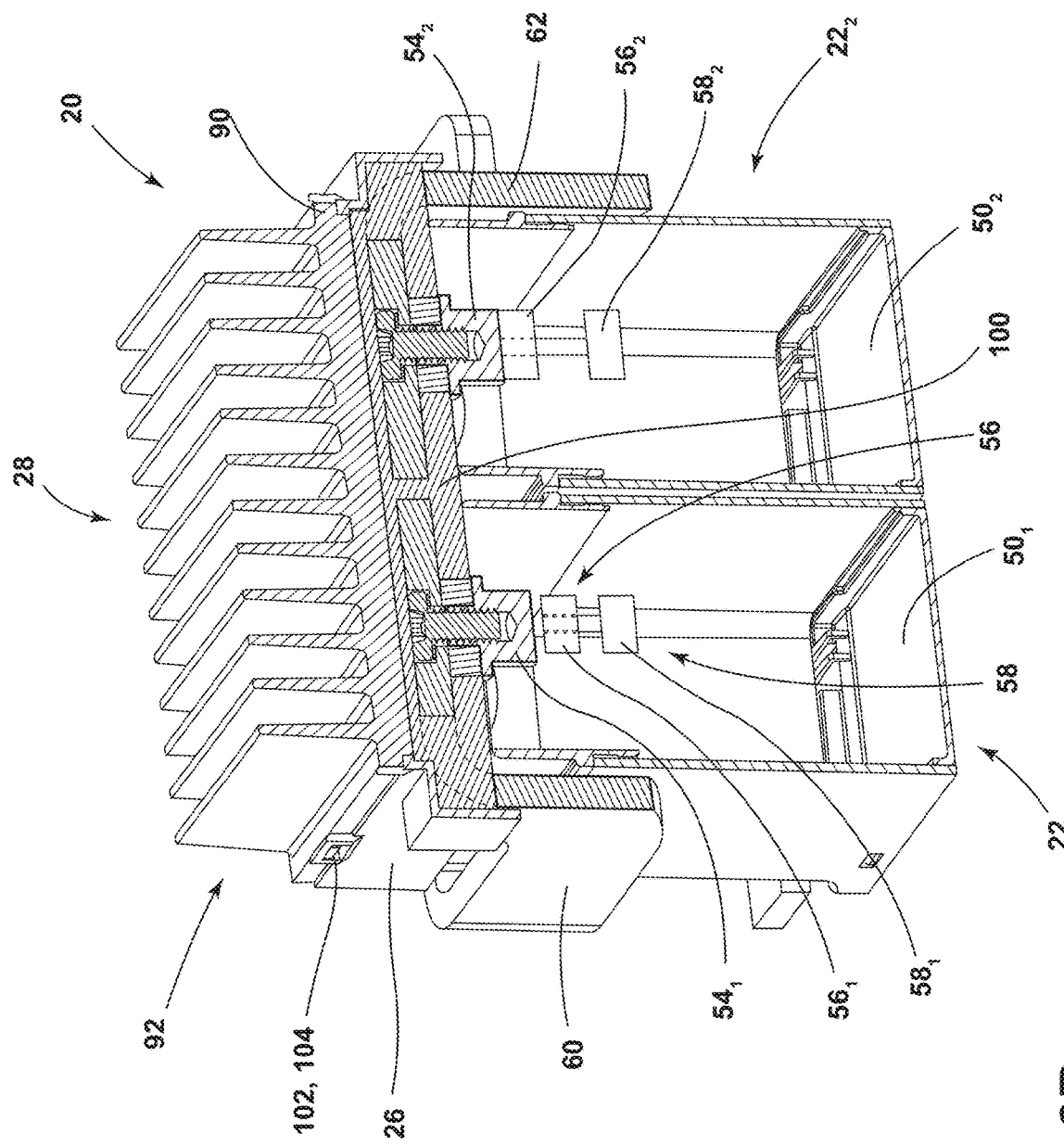
FIG. 6B is a cross-sectional perspective view generally illustrating an embodiment of an electrical assembly with an active second contactor and an inactive first contactor according to teachings of the present disclosure.

In embodiments, a contactor 22 may include a housing 50 (e.g., housings $50_1$, $50_2$), a first terminal (e.g., first terminals $52_1$, $52_2$), a second terminal 54 (e.g., second terminals $54_1$, $54_2$), an electrically conductive contact member 56 (e.g., contact members $56_1$, $56_2$) configured to selectively electrically connect the first terminal 52 and the second terminal 54, and/or actuator 58 (e.g., actuators $58_1$, $58_2$) (see, e.g., FIGS. 5-6B). An actuator 58 may be configured to change the contactor 22 from an inactive/open state in which the contact member 56 does not electrically connect the first terminal 52 and the second terminal 54 (see contactor $22_2$ in FIG. 6A and contactor $22_1$ in FIG. 6B), and an active/closed position in which the contact member 56 does electrically connect the first terminal 52 and the second terminal 54 (see contactor $22_1$ in FIG. 6A and contactor $22_2$ in FIG. 6B). An actuator 58 may, for example and without limitation, include an electromagnet. The first contactor $22_1$ and the second contactor $22_2$ may be disposed in the same configuration/orientation and/or may be in direct contact with each other.

Figure 3:
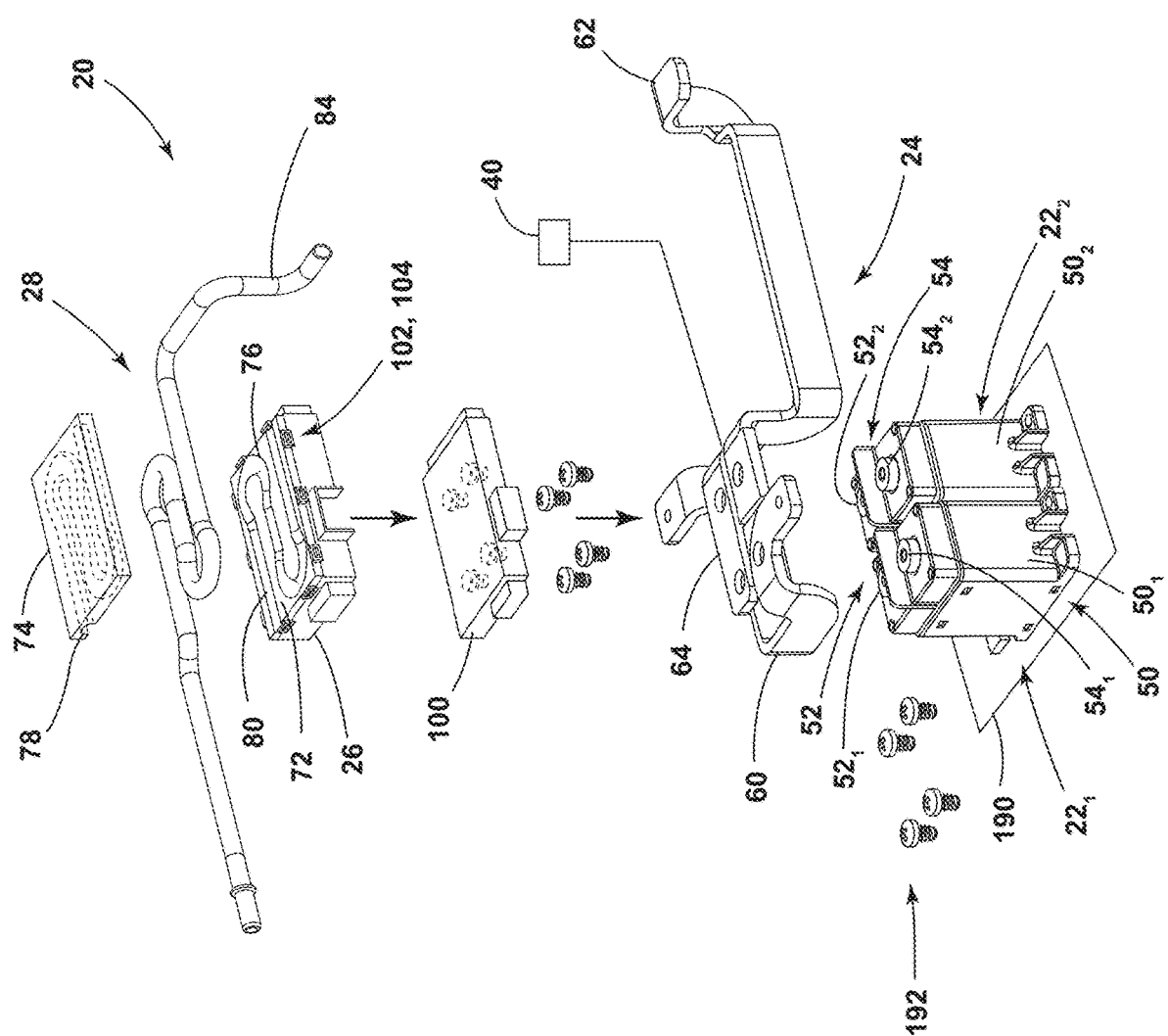
FIG. 3 is an exploded perspective view generally illustrating an embodiment of an electrical assembly according to teachings of the present disclosure.
Figure 4:
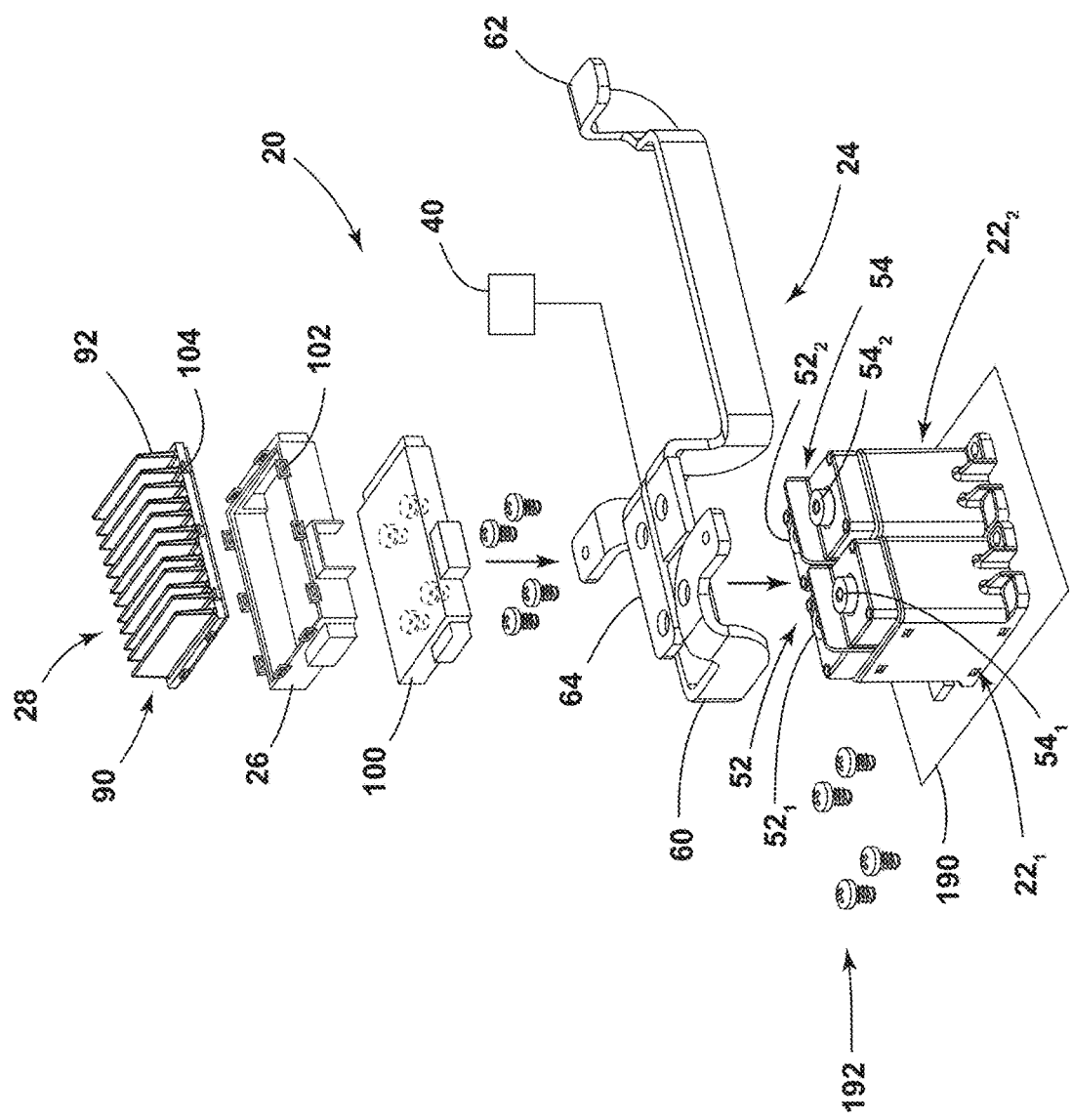
FIG. 4 is an exploded perspective view generally illustrating an embodiment of an electrical assembly according to teachings of the present disclosure.

With examples, such as generally illustrated in FIGS. 3 and 4, a bus bar assembly 24 may be electrically connected to the first contactor $22_1$, the second contactor $22_2$, and/or a power source 40 (e.g., a battery, an outlet, etc.). A bus bar assembly 24 may include a first bus bar 60, a second bus bar 62, and/or a third bus bar 64. The first bus bar 60 may be electrically connected to the first contactor $22_1$, such as to a second terminal $54_1$. The second bus bar 62 may be connected to the second contactor $22_2$, such as to a second terminal $54_2$. The third bus bar 64 may be electrically connected to the first contactor $22_1$ (e.g., to a first terminal $52_1$), the second contactor $22_2$ (e.g., to a first terminal $52_2$), and/or the power source 40, such as to electrically connect and/or provide power from the power source 40 to the first contactor $22_1$ and the second contactor $22_2$. The bus bar assembly 24 may, for example, be disposed, at least in part, directly on the first contactor $22_1$ and the second contactor $22_2$. For example and without limitation, the first bus bar 60 may be disposed directly on the first contactor $22_1$, the housing $50_1$ of the first contactor $22_1$, and/or the second terminal $54_1$ of the first contactor $22_1$, the second bus bar 62 may be disposed directly on the second contactor $22_2$, the housing $50_2$ of the second contactor $22_2$ and/or the second terminal $54_2$ of the second contactor $22_2$, and/or the third bus bar 64 may be disposed on the first contactor $22_1$ and the second contactor $22_2$, such as on the housing $50_1$ and the first terminal $52_1$ of the first contactor $22_1$ and on the housing $50_2$ and the first terminal $52_2$ of the second contactor $22_2$.

In examples, such as generally illustrated in FIGS. 1, 3, 4, and 6A, a cooling member 28 may include a first configuration that may be configured for active cooling (e.g., as an active cooling member). With the first configuration, the cooling member 28 may include a cold plate 70 having a first portion/member 72 and a second portion/member 74. The first portion 72 and the second portion 74 may be separate/independent (e.g., separate monolithic components) and may be configured to be connected together. The first portion 72 and the second portion 74 may be include corresponding recesses 76, 78 configured to cooperate to provide an internal fluid passage 80. The fluid passage 80 may be configured to receive a cooling fluid 82 (e.g., water, glycol, air, etc.) and/or a fluid conduit 84 (e.g., a pipe, tube, etc.) for the cooling fluid 82. The fluid passage 80 and/or the fluid conduit 84 may be connected to a fluid reservoir/tank 86 of cooling fluid 82 and/or a pump 88 that may pump the cooling fluid 82, such as from the fluid reservoir 86, through the cold plate 70 to dissipate heat from the electrical assembly 20.

Figure 7:
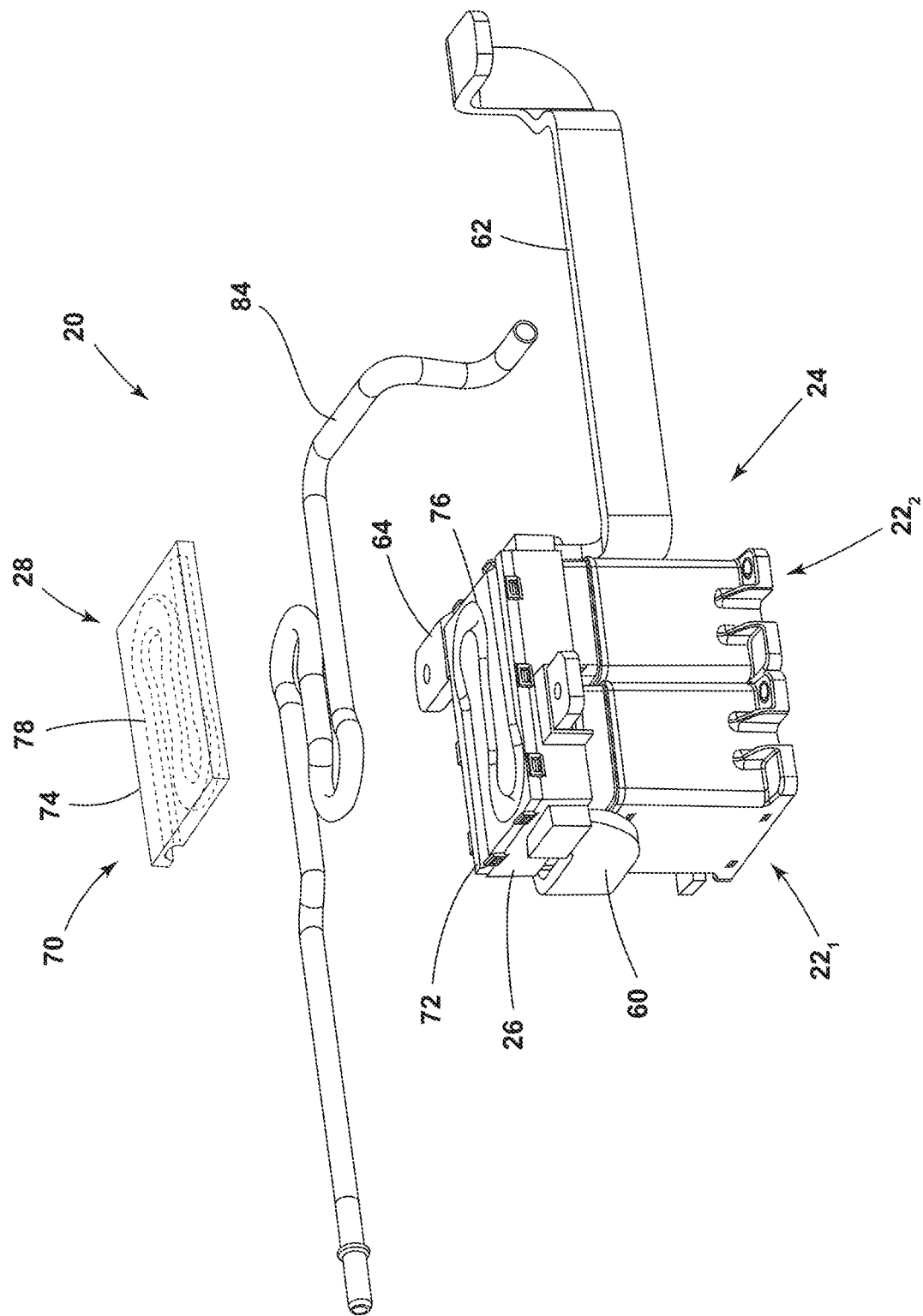
FIG. 7 is an exploded perspective view generally illustrating an embodiment of an electrical assembly according to teachings of the present disclosure.

With examples, such as generally illustrated in FIGS. 2, 5, and 7, a cooling member 28 may include a second configuration that may be configured for passive cooling (e.g., as a passive cooling member). With the second configuration, the cooling member 28 may include a heat sink 90 that may have a plurality of cooling fins 92 that may extend away from the first contactor $22_1$ and/or the second contactor $22_2$.

In embodiments, such as generally illustrated in FIGS. 3-7, potting material 100 may be disposed at least partially between the bus bar assembly 24/contactors 22 and the cooling member 28. The potting material 100 (e.g., thermal interface material) may be electrically insulating, thermally conductive, and/or may be configured to facilitate heat transfer from the bus bar assembly 24 and/or the contactors 22 to the cooling member 28. The bus bar assembly 24 and/or the contactors 22 may not be in direct contact with the cooling member 28.

With embodiments, such as generally illustrated in FIGS. 1-9, a bracket 26 may be configured to connect a cooling member 28 with the contactors 22 and may include one or more of a variety of shapes, sizes, materials, and/or configurations. For example and without limitation, the bracket 26 may include plastic and/or one or more electrically insulating materials, and may include a generally rectangular frame configuration. The bracket 26 and/or the cooling member 28 may include a modular configuration such that the bracket 26 may be configured to connect a cooling member 28 of the first configuration or a cooling member 28 of the second configuration with the contactors 22. For example and without limitation, the bracket 26 and the cooling member 28 may include one or more corresponding latching formations 102, 104 configured to connect the bracket 26 with the cooling member 28. The bracket 26 may be disposed at least partially around the outside of the contactors 22, the cooling member 28, and/or the potting material 100.

Figure 10:
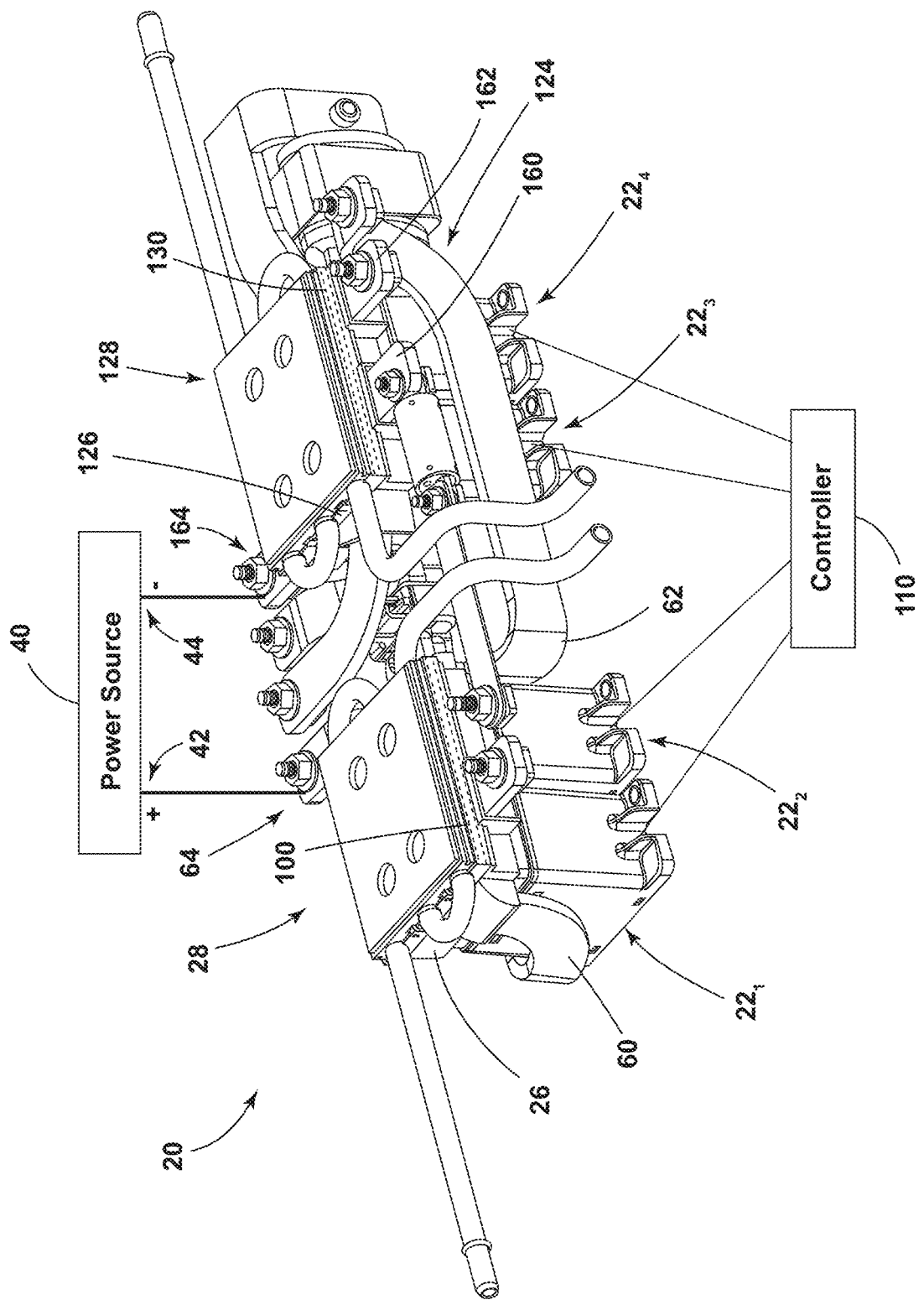
FIG. 10 is a perspective view generally illustrating an embodiment of an electrical assembly according to teachings of the present disclosure.
Figure 11:
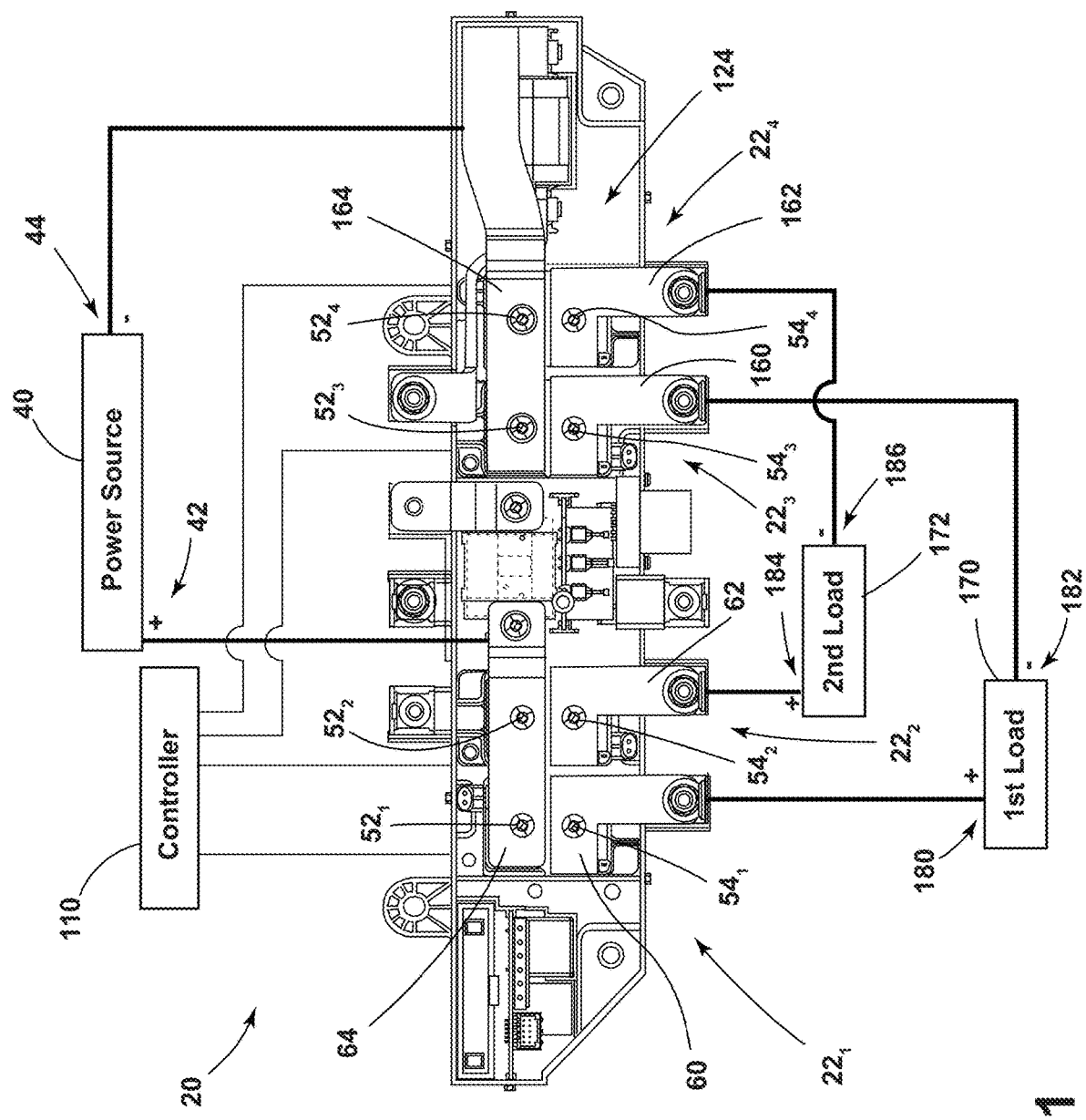
FIG. 11 is a cross-sectional view generally illustrating an embodiment of an electrical assembly according to teachings of the present disclosure.

In examples, such as generally illustrated in FIGS. 10 and 11, an electrical assembly 20, the first contactor $22_1$, and/or the second contactor $22_2$ may be configured such that only one of the first contactor $22_1$ and the second contactor $22_2$ is active at any particular time. The other of the first contactor $22_1$ and the second contactor $22_2$ (e.g., the inactive contactor) and/or the bus bar 60, 62 associated with the inactive contactor 22 may be configured to function as a thermal mass for the active contactor 22, such as to facilitate cooling of the active contactor 22. With examples, an electronic controller/processor 110 may be connected (e.g., via wired and/or wireless connection) to and/or configured to control the contactors 22, such as via controlling movement of a contact member 56 via selective activation of an actuator 58. For example and without limitation, the controller 110 may be configured to activate only one of the contactors 22 at a time and maintain the other contactor 22 in an inactive state such that the inactive contactor 22 (and/or a bus bar 60, 62 connected thereto) acts as a thermal mass for the active contactor 22.

With examples, such as generally illustrated in FIGS. 10 and 11, an electrical assembly 20 may include a third contactor $22_3$, a fourth contactor $22_4$, a second bus bar assembly 124 electrically connected to the third contactor $22_3$ and the fourth contactor $22_4$, a second cooling member 128, a second bracket 126 configured to connect the cooling member 128 with the third contactor $22_3$ and the fourth contactor $22_4$, and/or second potting material 130 that may be disposed at least partially between the second bus bar assembly 124 and the second cooling member 128. The first bus bar assembly 24 (e.g., the third bus bar 64) may be connected to a positive terminal 42 of a power source 40 and/or the second bus bar assembly 124 may be connected to a negative terminal 44 of the power source 40. The second bus bar assembly 124 may, for example and without limitation, include a first bus bar 160 connected to a second terminal $54_3$ of the third contactor $22_3$, a second bus bar 162 connected to the second terminal $54_4$ of the fourth contactor $22_4$, and/or a third bus bar 164 connected to the first terminals $52_3$, $52_4$ of the third and fourth contactors $22_3$, $22_4$ (e.g., may include fourth, fifth, and sixth bus bars). The third bus bar 164 may be connected (e.g., electrically) to a negative terminal 44 of the power source 40. The controller 110 may be configured to (i) control the first contactor $22_1$ and the second contactor $22_2$ such that one of the first contactor $22_1$ and the second contactor $22_2$ is active and the other contactor 22 is inactive and functions as a first thermal mass for facilitating cooling of the active contactor 22 of the first contactor $22_1$ and the second contactor $22_2$, and/or (ii) control the third contactor $22_3$ and the fourth contactor $22_4$ such that one of the third contactor $22_3$ and the fourth contactor $22_4$ is active and the other contactor 22 is inactive and functions as a second thermal mass for facilitating cooling of the active contactor 22 of the third contactor $22_3$ and the fourth contactor $22_4$.

In examples, a first contactor $22_1$ and a second contactor $22_2$ may be configured as positive contactors and the third contactor $22_3$ and the fourth contactor $22_4$ may be configured as negative contactors. The first and second contactors $22_1$, $22_2$ may be separate from the third and fourth contactors $22_3$, $22_4$, which may reduce the chances of an electrical short, such as in the event of a leak of cooling fluid 82. For example and without limitation, the first and second contactors $22_1$, $22_2$ may be spaced from the third and fourth contactors $22_3$, $22_4$, such as by a distance of about the width of a contactor housing 50 (or a larger or smaller distance).

With embodiments, such as generally illustrated in FIG. 11, a first contactor $22_1$ and/or a third contactor $22_3$ may be electrically connected to a first electrical load 170, and/or a second contactor $22_2$ and/or a fourth contactor $22_4$ may be connected to a second electrical load 172. For example and without limitation, the first bus bar 60 of the first bus bar assembly 24 may be electrically connected to a positive terminal 180 of the first electrical load 170, the first bus bar 160 of the second bus bar assembly 124 may be electrically connected to a negative terminal 182 of the first electrical load 170, the second bus bar 62 of the first bus bar assembly 24 may be electrically connected to a positive terminal 184 of the second electrical load 172, and/or the second bus bar 162 of the second bus bar assembly 124 may be electrically connected to a negative terminal 186 of the second electrical load 172. When both the first contactor $22_1$ and the third contactor $22_3$ are active, power may be provided from the power source 40 to the first electrical load 170. When both the second contactor $22_2$ and the fourth contactor $22_4$ are active, power may be provided from the power source 40 to the second electrical load 172.

In embodiments, a controller 110 may be configured to control the contactors 22 to selectively to provide power to the first electrical load 170 and/or the second electrical load 172. In embodiments, the first electrical load 170 and the second electrical load 172 may be complementary, which may include the first electrical load 170 and second electrical load 172 being configured such that only one would be expected to be activated/operated at any given time. For example and without limitation, the first electrical load 170 may include an air conditioner (e.g., to provide cooled air, such as in a vehicle) and/or the second electrical load 172 may include a heater (e.g., to provide warmed air, such as in the vehicle).

Figure 12:
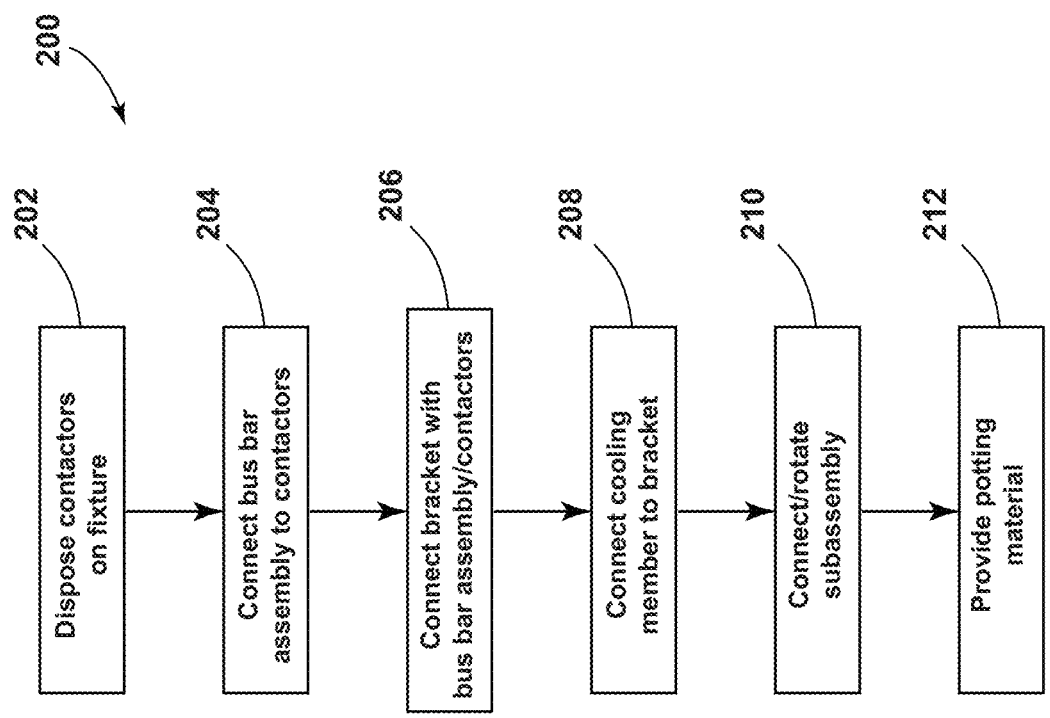
FIG. 12 is a flow chart generally illustrating an embodiment of a method of assembling an electrical assembly according to teachings of the present disclosure.

With examples, such as generally illustrated in FIG. 12, a method 200 of assembling an electrical assembly 20 may include disposing two contactors 22 (e.g., the first and second contactors $22_1$, $22_2$ or the third and fourth contactors $22_3$, $22_4$) on an assembly fixture 190 (block 202). The method 200 may include connecting a bus bar assembly 24, 124 to the contactors 22 (block 204) and then connecting a bracket 26, 126 with the bus bar assembly 24, 124 and/or the contactors 22 (block 206). A cooling member 28, 128 may be connected (e.g., snapped into) the bracket 26, 126 (block 208). If the cooling member 28, 128 is an active cooling member, a first/bottom portion 72 of an active cooling member 28, 128 may be connected (e.g., snapped into) the bracket 26, 126. Thermal interface material 100 (e.g., additional potting material) may be applied to the conduit recess 76 of the bottom portion 72 and/or the conduit recess 78 of the top portion 74, such as to facilitate heat transfer from the cold plate 70 to the fluid conduit 84 and/or a cooling fluid 82 therein. The fluid conduit 84 may be disposed at least partially in the conduit recess 76 and the second/top portion 74 of the cooling member 28, 128 may be connected to the first/bottom portion 72 and/or the fluid conduit 84.

Figure 8:
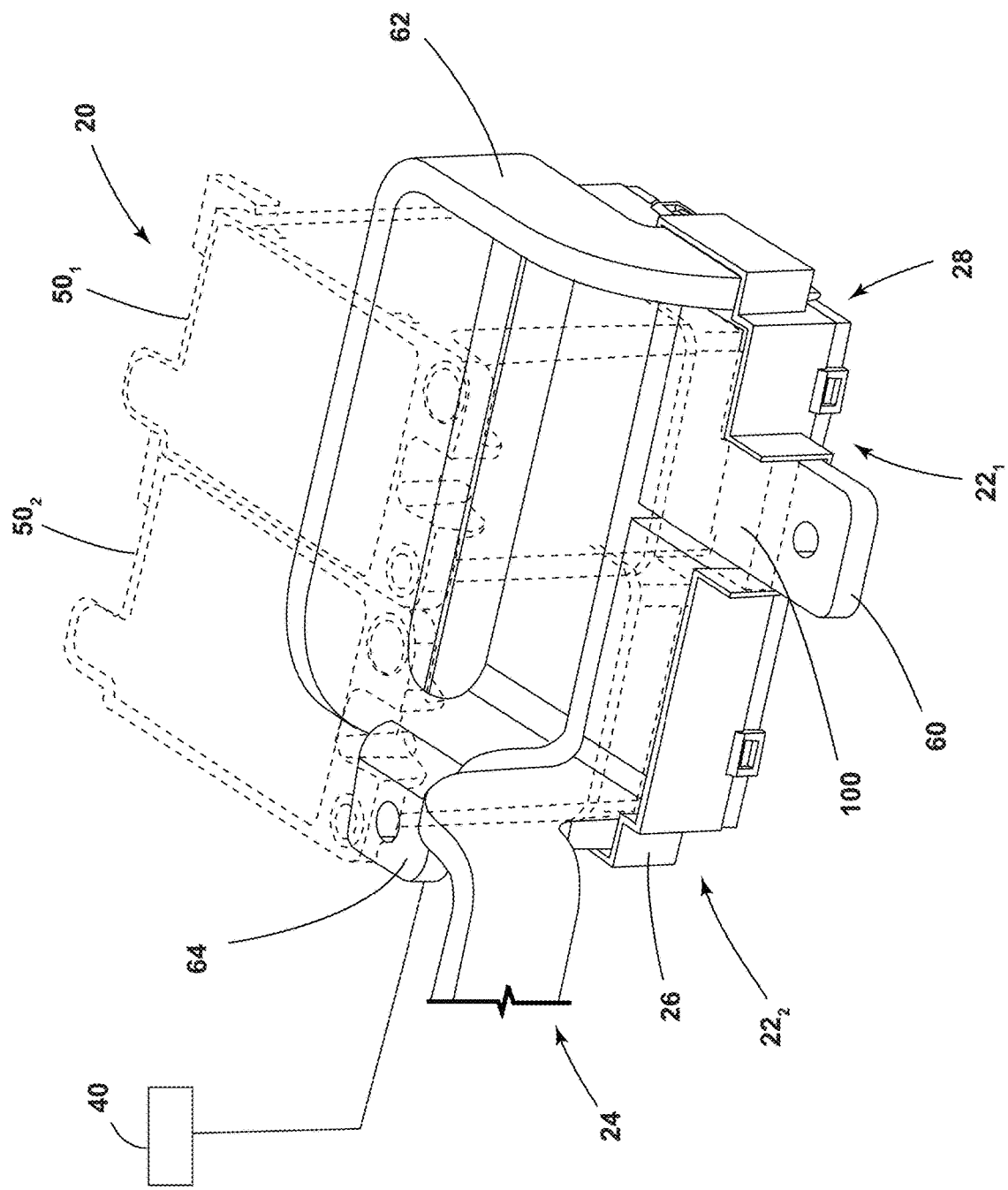
FIG. 8 is a perspective view generally illustrating an embodiment of an electrical assembly according to teachings of the present disclosure.
Figure 9:
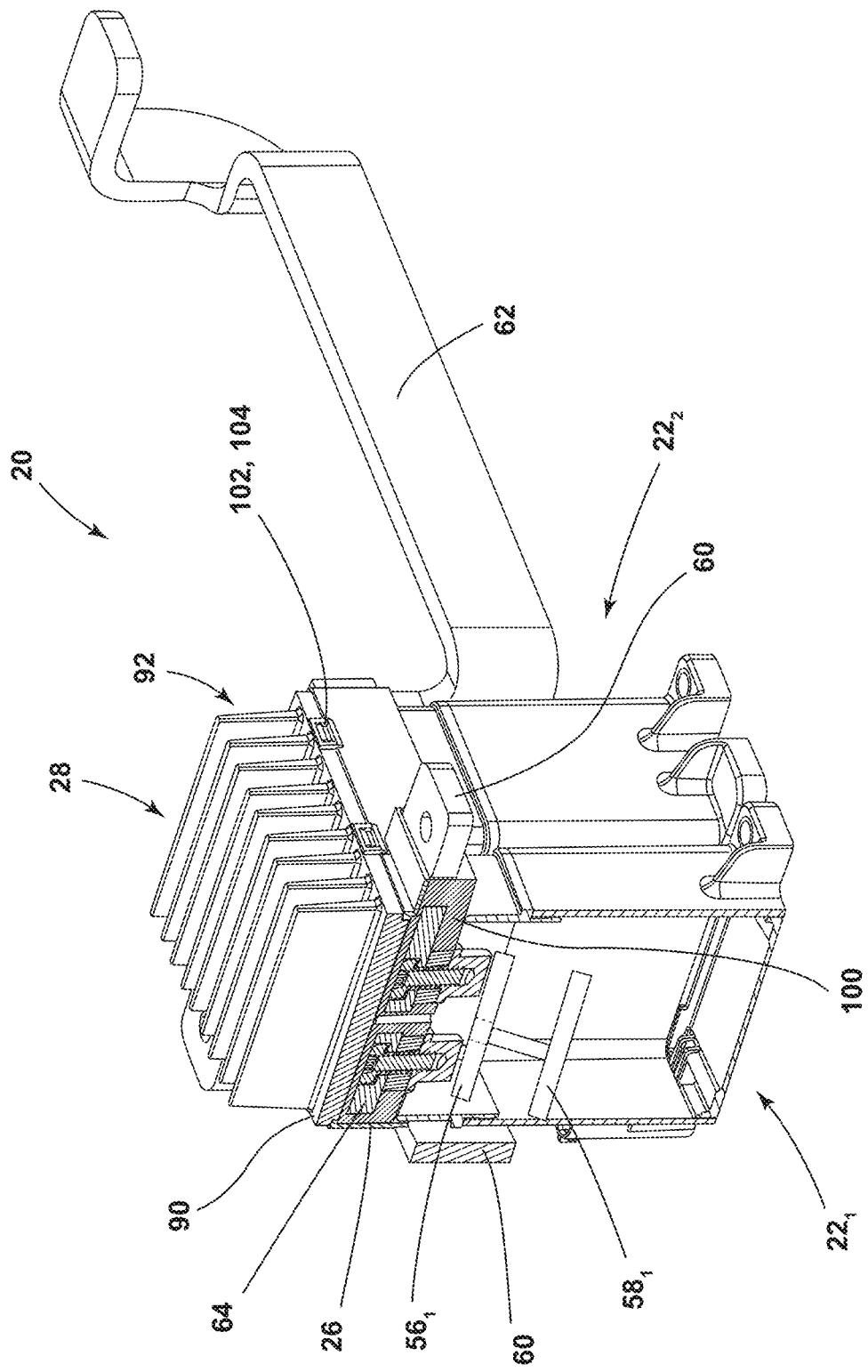
FIG. 9 is a cross-sectional perspective view generally illustrating an embodiment of an electrical assembly according to teachings of the present disclosure.

In embodiments, the method 200 may include connecting the subassembly together (e.g., the contactors 22 may be fixed together, the bus bar assembly 24, 124 may be fixed to the contactors 22, etc.), such as via one or more screws 192, and the subassembly may then be rotated upside down (block 210) (see, e.g., FIG. 8). The method 200 may include providing potting material 100 (e.g., thermal interface material), such via inserting/injecting (e.g., under vacuum) potting material 100 between the cooling member 28, 128, the contactors 22, and/or the bus bar assembly 24, 124 (block 212).

Figure 13:
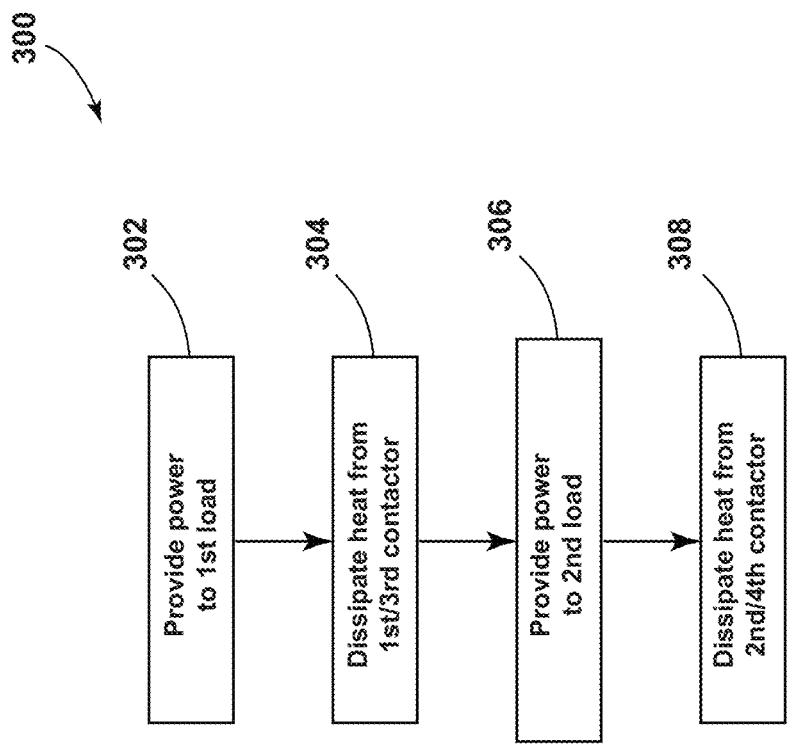
FIG. 13 is a flow chart generally illustrating an embodiment of a method of operating an electrical assembly according to teachings of the present disclosure.

In embodiments, such as generally illustrated in FIG. 13, a method 300 of operating an electrical assembly 20 may include providing power from a power source 40 to a first electrical load 170 (block 302), such as via the bus bar assembly 24, the first contactor $22_1$, the second bus bar assembly 124, and/or the third contactor $22_3$. For example and without limitation, the third bus bar 64 of the first bus bar assembly 24 may provide (at least in part) an electrical connection between a positive terminal 42 of the power source 40 and a first terminal $52_1$ of the first contactor $22_1$, a controller 110 may activate the first contactor $22_1$ to provide an electrical connection between the first terminal $52_1$ and the second terminal $54_1$ of the first contactor $22_1$, the first bus bar 60 of the first bus bar assembly 24 may provide (at least in part) an electrical connection between the second terminal $54_1$ and a positive terminal 180 of the first electrical load 170, the first bus bar 160 of the second bus bar assembly 124 may provide (at least in part) an electrical connection between a negative terminal 182 of the first electrical load 170 and the second terminal $54_3$ of the third contactor $22_3$, the controller 110 may activate the third contactor $22_3$ to provide an electrical connection between the second terminal $54_3$ and the first terminal $52_3$ of the third contactor $22_3$, and/or the third bus bar 164 of the second bus bar assembly 124 may provide (at least in part) an electrical connection between the first terminal $52_3$ of the third contactor $22_3$ and a negative terminal 44 of the power source 40.

With embodiments, the method 300 may include dissipating heat, while providing power to said first electrical load 170, from the first contactor $22_1$ and/or the third contactor $22_3$ (block 304). Dissipating heat from the first contactor $22_1$ may include dissipating heat via the second contactor $22_2$ and/or the second bus bar 62 of the first bus bar assembly 24. Dissipating heat from the third contactor $22_3$ may include dissipating heat via the fourth contactor $22_4$ and/or the second bus bar 162 of the second bus bar assembly 124.

In embodiments, the method 300 may include providing power from the power source 40 to a second electrical load 172 (block 306), such as via the bus bar assembly 24, the second contactor $22_2$, the second bus bar assembly 124, and the fourth contactor $22_4$. For example and without limitation, the third bus bar 64 of the first bus bar assembly 24 may provide (at least in part) an electrical connection between a positive terminal 42 of the power source 40 and a first terminal $52_2$ of the second contactor $22_2$, a controller 110 may activate the second contactor $22_2$ to provide an electrical connection between the first terminal $52_2$ and the second terminal $54_2$ of the second contactor $22_2$, the second bus bar 62 of the first bus bar assembly 24 may provide (at least in part) an electrical connection between the second terminal $54_2$ of the second contactor $22_2$ and a positive terminal 184 of the second electrical load 172, the second bus bar 162 of the second bus bar assembly 124 may provide (at least in part) an electrical connection between a negative terminal 186 of the second electrical load 172 and the second terminal $54_4$ of the fourth contactor $22_4$, the controller 110 may activate the fourth contactor $22_4$ to provide an electrical connection between the second terminal $54_4$ and the first terminal $52_4$ of the fourth contactor $22_4$, and/or the third bus bar 164 of the second bus bar assembly 124 may provide (at least in part) an electrical connection between the first terminal $52_4$ of the fourth contactor $22_4$ and a negative terminal 44 of the power source 40.

With embodiments, the method 300 may include dissipating heat, while providing power to said second electrical load 172, from the second contactor $22_2$ and/or the fourth contactor $22_4$ (block 308). Dissipating heat from the second contactor $22_2$ may include dissipating heat via the first contactor $22_1$ and/or the first bus bar 60 of the first bus bar assembly 24. Dissipating heat from the fourth contactor $22_4$ may include dissipating heat via the third contactor $22_3$ and/or the first bus bar 160 of the second bus bar assembly 124.

In embodiments, the second contactor $22_2$ and/or the fourth contactor $22_4$ may be inactive (e.g., the controller 110 may deactivate/open the second contactor $22_2$ and/or the fourth contactor $22_4$) while providing power from said power source 40 to said first electrical load 170, dissipating heat from the first contactor $22_1$, and/or dissipating heat from the third contactor $22_3$. The first contactor $22_1$ and/or the third contactor $22_3$ may be inactive (e.g., the controller 110 may deactivate/open the first contactor $22_1$ and/or the third contactor $22_3$) while providing power from said power source 40 to said second electrical load 172, dissipating heat from the second contactor $22_2$, and/or dissipating heat from the fourth contactor $22_4$.

In examples, a controller (e.g., controller 110) may include an electronic controller and/or include an electronic processor, such as a programmable microprocessor and/or microcontroller. In embodiments, a controller may include, for example, an application specific integrated circuit (ASIC). A controller may include a central processing unit (CPU), a memory (e.g., a non-transitory computer-readable storage medium), and/or an input/output (I/O) interface. A controller may be configured to perform various functions, including those described in greater detail herein, with appropriate programming instructions and/or code embodied in software, hardware, and/or other medium. In embodiments, a controller may include a plurality of controllers. In embodiments, a controller may be connected to a display, such as a touchscreen display.

Various examples/embodiments are described herein for various apparatuses, systems, and/or methods. Numerous specific details are set forth to provide a thorough understanding of the overall structure, function, manufacture, and use of the examples/embodiments as described in the specification and illustrated in the accompanying drawings. It will be understood by those skilled in the art, however, that the examples/embodiments may be practiced without such specific details. In other instances, well-known operations, components, and elements have not been described in detail so as not to obscure the examples/embodiments described in the specification. Those of ordinary skill in the art will understand that the examples/embodiments described and illustrated herein are non-limiting examples, and thus it can be appreciated that the specific structural and functional details disclosed herein may be representative and do not necessarily limit the scope of the embodiments.

Reference throughout the specification to "examples, "in examples," "with examples," "various embodiments," "with embodiments," "in embodiments," or "an embodiment," or the like, means that a particular feature, structure, or characteristic described in connection with the example/embodiment is included in at least one embodiment. Thus, appearances of the phrases "examples, "in examples," "with examples," "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more examples/embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such element. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of examples/ embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." in the specification is to be construed broadly and is used to provide non-limiting examples of embodiments of the disclosure, and the disclosure is not limited to such examples. Uses of "and" and "or" are to be construed broadly (e.g., to be treated as "and/or"). For example and without limitation, uses of "and" do not necessarily require all elements or features listed, and uses of "or" are inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/ or with certain described steps omitted.

All matter contained in the above description or shown in the accompanying drawings shall be interpreted as illustrative only and not limiting. Changes in detail or structure may be made without departing from the present disclosure.

It should be understood that a controller, a system, and/or a processor as described herein may include a conventional processing apparatus known in the art, which may be capable of executing preprogrammed instructions stored in an associated memory, all performing in accordance with the functionality described herein. To the extent that the methods described herein are embodied in software, the resulting software can be stored in an associated memory and can also constitute means for performing such methods. Such a system or processor may further be of the type having ROM, RAM, RAM and ROM, and/or a combination of non-volatile and volatile memory so that any software may be stored and yet allow storage and processing of dynamically produced data and/or signals.

It should be further understood that an article of manufacture in accordance with this disclosure may include a non-transitory computer-readable storage medium having a computer program encoded thereon for implementing logic and other functionality described herein. The computer program may include code to perform one or more of the methods disclosed herein. Such embodiments may be configured to execute via one or more processors, such as multiple processors that are integrated into a single system or are distributed over and connected together through a communications network, and the communications network may be wired and/or wireless. Code for implementing one or more of the features described in connection with one or more embodiments may, when executed by a processor, cause a plurality of transistors to change from a first state to a second state. A specific pattern of change (e.g., which transistors change state and which transistors do not), may be dictated, at least partially, by the logic and/or code.

What is claimed is:

1. An electrical assembly, comprising:
   a first contactor;
   a second contactor;
   a bus bar assembly electrically connected to the first contactor and the second contactor;
   a cooling member;
   a bracket configured to connect the cooling member to the first contactor and the second contactor; and
   potting material disposed at least partially between the bus bar assembly and the cooling member;
   wherein cooling member has (i) an active configuration with a cold plate and a fluid passage or (ii) a passive configuration having a heat sink with a plurality of cooling fins; and
   the bracket and the cooling member are modular such that the bracket is configured for connection with the active configuration of the cooling member and the passive configuration of the cooling member.

2. The electrical assembly of claim 1, including an electronic controller connected to the first contactor and the second contactor;
   wherein the electronic controller is configured to control the first contactor and the second contactor such that one of the first contactor and the second contactor is active and the other contactor is inactive and functions as a thermal mass for facilitating cooling of the active contactor.

3. The electrical assembly of claim 2, wherein the first contactor and the second contactor are disposed in the same configuration and are in direct contact with each other.

4. The electrical assembly of claim 1, wherein the bus bar assembly includes a first bus bar, a second bus bar, and a third bus bar;
   the first contactor and the second contactor each include a first terminal and a second terminal;
   the third bus bar is connected directly to the first terminals of the first contactor and the second contactor;
   the first bus bar is connected directly to the second terminal of the first contactor; and
   the second bus bar connected directly to the second terminal of the second contactor.

5. The electrical assembly of claim 4, wherein the first bus bar is electrically connected to a first electrical load;
   the second bus bar is electrically connected to a second electrical load; and
   the third bus bar is electrically connected to a power source configured to provide power to the first electrical load and the second electrical load via the first contactor and the second contactor.

6. The electrical assembly of claim 1, including:
   a third contactor;
   a fourth contactor;
   a second bus bar assembly electrically connected to the third contactor and the fourth contactor;
   a second cooling member;
   a second bracket configured to connect the second cooling member with the third contactor and the fourth contactor; and
   second potting material disposed at least partially between the second bus bar assembly and the second cooling member.

7. The electrical assembly of claim 6, wherein the bus bar assembly is connected to a positive terminal of a power source and the second bus bar assembly is connected to a negative terminal of said power source.

8. The electrical assembly of claim 7, including a controller configured to:
   (i) control the first contactor and the second contactor such that one of the first contactor and the second contactor is active and the other of the first contactor and the second contactor is inactive and functions as a first thermal mass for facilitating cooling of the active contactor of the first contactor and the second contactor, and (ii) control the third contactor and the fourth contactor such that one of the third contactor and the fourth contactor is active and the other of the third contactor and the fourth contactor is inactive and functions as a second thermal mass for facilitating cooling of the active contactor of the third contactor and the fourth contactor.

9. The electrical assembly of claim 1, wherein:
the cooling member is configured as the active cooling member; and
the cold plate has a first portion and a second portion with corresponding recesses that define the fluid passage.

10. The electrical assembly of claim 9, wherein the cooling member includes a fluid conduit disposed at least partially in the fluid passage.

11. The electrical assembly of claim 10, wherein additional potting material is disposed between the cold plate and the fluid conduit to facilitate heat transfer from the cold plate to the fluid conduit.

12. A method of assembling an electrical assembly including a first contactor, a second contactor, a bus bar assembly electrically connected to the first contactor and the second contactor, a cooling member, a bracket configured to connect the cooling member to the first contactor and the second contactor, and potting material disposed at least partially between the bus bar assembly and the cooling member, the method comprising:
disposing the first contactor and the second contactor on a fixture;
connecting the bus bar assembly to the first contactor and the second contactor;
connecting the bracket to the bus bar assembly, the first contactor, and/or the second contactor;
connecting the cooling member to the bracket; and
providing the potting material between the bus bar assembly and the cooling member;
wherein:
the bus bar assembly includes a first bus bar, a second bus bar, and a third bus bar; and
connecting the bus bar assembly to the first contactor and the second contactor includes:
connecting the third bus bar directly to a first terminal of the first contactor and directly to a first terminal of the second contactor;
connecting the first bus bar directly to a second terminal of the first contactor; and
connecting the second bus bar directly to a second terminal of the second contactor.

13. A method of operating an electrical assembly including a first contactor, a second contactor, a bus bar assembly electrically connected to the first contactor and the second contactor, a cooling member, a bracket configured to connect the cooling member to the first contactor and the second contactor, and potting material disposed at least partially between the bus bar assembly and the cooling member, the method comprising:
dissipating heat from the first contactor via the second contactor while providing power from a power source to a first electrical load via the bus bar assembly and the first contactor; and
dissipating heat from the second contactor via the first contactor while providing power from the power source to a second electrical load via the bus bar assembly and the second contactor;
wherein the second contactor is inactive while power is provided from the power source to the first electrical load; and
the first contactor is inactive while power is provided from the power source to the second electrical load.

14. The method of claim 13, wherein the electrical assembly includes a third contactor, a fourth contactor, a second bus bar assembly electrically connected to the third contactor and the fourth contactor, a second cooling member, a second bracket configured to connect the second cooling member with the third contactor and the fourth contactor, and second potting material disposed at least partially between the second bus bar assembly and the second cooling member, and wherein the method further comprising:
providing power from the power source to the first electrical load via the second bus bar assembly and the third contactor; and
dissipating heat, while providing power to said first electrical load and dissipating heat from the first contactor, from the third contactor via the fourth contactor.

15. The method of claim 14, including:
providing power from said power source to a second electrical load via the bus bar assembly, the second contactor, the second bus bar assembly, and the fourth contactor;
dissipating heat, while providing power to said second electrical load, from the second contactor via the first contactor; and
dissipating heat, while providing power to said second electrical load and dissipating heat from the second contactor, from the fourth contactor via the third contactor.

16. The method of claim 15, wherein the second contactor and the fourth contactor are inactive while providing power from said power source to said first electrical load, dissipating heat from the first contactor, and dissipating heat from the third contactor.

17. The method of claim 16, wherein the first contactor and the third contactor are inactive while providing power from said power source to said second electrical load, dissipating heat from the second contactor, and dissipating heat from the fourth contactor.

18. The method of claim 15, wherein the bus bar assembly includes a first bus bar, a second bus bar, and a third bus bar; and
the second bus bar assembly includes a fourth bus bar, a fifth bus bar, and a sixth bus bar.

19. The method of claim 18, wherein the second contactor, the fourth contactor, the second bus bar, and the fifth bus bar function as thermal masses while dissipating heat from the first contactor and the third contactor; and
the first contactor, the third contactor, the first bus bar, and the fourth bus bar function as thermal masses while dissipating heat from the second contactor and the fourth contactor.

20. The method of claim 13, wherein:
the bus bar assembly includes a first bus bar, a second bus bar, and a third bus bar;
the third bus bar is connected directly to a first terminal of the first contactor and directly to a first terminal of the second contactor;
the first bus bar is connected directly to a second terminal of the first contactor; and the second bus bar is connected directly to a second terminal of the second contactor.

\* \* \* \* \*